(12) United States Patent
Reynolds

(10) Patent No.: US 6,929,720 B2
(45) Date of Patent: Aug. 16, 2005

(54) SPUTTERING SOURCE FOR IONIZED PHYSICAL VAPOR DEPOSITION OF METALS

(75) Inventor: Glyn Jeremy Reynolds, Las Vegas, NV (US)

(73) Assignee: Tokyo Electron Limited, Tokyo (JP)

( * ) Notice: Subject to any disclaimer, the term of this patent is extended or adjusted under 35 U.S.C. 154(b) by 158 days.

(21) Appl. No.: 10/457,723

(22) Filed: Jun. 9, 2003

(65) Prior Publication Data

US 2004/0245092 A1 Dec. 9, 2004

(51) Int. Cl.⁷ .............................................. C23C 14/34
(52) U.S. Cl. ........................... 204/192.3; 204/298.06; 204/298.11; 204/298.21
(58) Field of Search ................. 204/192.12, 192.3, 204/298.06, 298.11, 298.21

(56) References Cited

U.S. PATENT DOCUMENTS

| | | | |
|---|---|---|---|
| 4,622,121 A | 11/1986 | Wegmann et al. | 204/298 |
| 5,178,739 A * | 1/1993 | Barnes et al. | 204/192.12 |
| 5,354,443 A * | 10/1994 | Moslehi | 204/192.12 |
| 5,482,611 A | 1/1996 | Helmer et al. | 204/298.17 |
| 6,080,287 A | 6/2000 | Drewery et al. | 204/192.15 |
| 6,187,160 B1 * | 2/2001 | Rick et al. | 204/298.22 |
| 6,231,725 B1 | 5/2001 | Nulman et al. | 204/192.12 |
| 6,287,435 B1 | 9/2001 | Drewery et al. | 204/298.09 |
| 6,613,199 B1 * | 9/2003 | Tobin et al. | 204/192.12 |

FOREIGN PATENT DOCUMENTS

| | | | | |
|---|---|---|---|---|
| WO | WO 98/31845 | | 7/1998 | C23C/14/00 |
| WO | WO 02/091461 A2 | | 11/2002 | H01L/21/768 |

* cited by examiner

Primary Examiner—Steven H VerSteeg
(74) Attorney, Agent, or Firm—Wood, Herron & Evans, L. L. P.

(57) ABSTRACT

A plasma processing system is provided with a cylindrical target, open at both ends, and with a magnet array that forms a hollow cathode magnetron (HCM). At one of the open ends is placed an inductively coupled RF energy source. A dielectric window at one end of the cylindrical target forms a seal between atmosphere and the processing system. A deposition baffle shield permits the coupling of RF energy from the coil into the chamber. The open end of the cylindrical target opposite the RF source faces the processing space. Magnetron magnets produce a magnetic trapping field having a null which acts as a mirror and separates a plasma-source from the processing space.

20 Claims, 2 Drawing Sheets

SPUTTERING SOURCE FOR IONIZED PHYSICAL VAPOR DEPOSITION OF METALS

This invention relates to the generation of high-density plasma useful in processes such as semiconductor wafer processing, and particularly useful for the ionized physical vapor deposition of metals onto semiconductor substrates.

BACKGROUND OF THE INVENTION

Ionized Physical Vapor Deposition (iPVD) has been proposed for depositing films onto semiconductor wafer substrates, particularly where the sidewalls or bottoms of high aspect ratio sub-micron features are to be coated. The iPVD process is particularly proposed for the depositions of metals such as tantalum and copper. For iPVD in such applications, high-density low-potential plasma is produced in a sputter processing chamber to energize sputtered material, typically metal, that has been sputtered from a target by ions formed by a separate higher-potential plasma and accelerated across a plasma sheath at the target. The high-density low-potential plasma is employed to produce a high ion fraction or high percentage of ionized sputtered material, so that the coating material ions can be electrically attracted onto a substrate at nearly right angles to the substrate surface.

DC energy has been the primary energy source for the higher-potential plasma used for sputtering material from the target. Inductively coupled plasma (ICP) has been found to be useful in iPVD for energizing the high-density low-potential plasma used for ionizing the material that has been sputtered. In particular, iPVD devices and processes have been proposed having an ionized sputtered material source formed of an annular sputtering target with an RF energy source situated in the center of the target. Such sources are disclosed in U.S. Pat. Nos. 6,080,287 and 6,287,435, both hereby expressly incorporated by reference herein.

The sources of these iPVD devices and methods have provided features that are superior in many respects to other sources of the prior art. Such sources have been built with 5.5 kW RF power supplies that operate at a frequency of approximately 13.56 MHz, are relatively compact and not too expensive. Higher power than some such sources provide may be desired to couple more energy into the plasma and thereby increase the ion fraction in the plasma. Providing such higher power with a larger RF power supply of, for example, 10 kW, would currently add tens of thousands of dollars to the cost of the module, with additional costs also associated with the matching network and the increased cooling that would be required. Further, while 5 kW RF supplies are now built with solid state components, larger RF supplies often employ vacuum tubes, which are large and very heavy.

Furthermore, iPVD sources built according to the patents referenced above operate most effectively at higher pressures (above 60 mTorr). Depending on the application, use of higher pressures requires care to avoid gas phase nucleation, which can cause particles to form in the plasma, and makes the tolerances of the dark spaces more critical. At some point, increasing pressure can potentially cause a target to arc to an adjacent structure, which can result in significant damage and generate enormous quantities of particles that would contaminate the wafers to be processed.

Accordingly, it would be beneficial to efficiently increase the energy coupled to the plasma in an iPVD apparatus of the above patents. It would be further beneficial to equip such apparatus with the capability of operating at lower pressures while retaining the other advantages of such an apparatus.

A large number of sputtering sources have been devised for semiconductor wafer processing, and each has its own features. One such source that has features of the invention described below is the so-called Hollow Cathode Magnetron (HCM) described in U.S. Pat. No. 5,482,611. The apparatus in this patent is a sputter magnetron ion source for producing in a high density plasma, which it generates in a cylindrical cathode cavity. Ions of target material are extracted from the cavity into a beam by producing a magnetic field cusp configuration with the magnetron magnets at a null region adjacent to the open end of the cathode cavity. The HCM source has been proposed and is currently used for iPVD.

One of the major drawbacks to the HCM source is that targets of the configuration proposed are extremely expensive. This is especially the case for metals such as tantalum. The large bucket type cathode of the HCM is difficult to fabricate and uses a large amount of expensive target grade material. Furthermore, in use, the material at the closed end of the cylindrical cavity in the target is eroded very little. In some HCM targets, there has been a net deposition at the closed end of the target, which, in addition to poor target utilization, has led to particle problems. To avoid such problems, a small rotating permanent magnet has been added to some HCM devices behind the target at the closed end of the cavity, which has added equipment cost and complexity. The HCM uses very high DC powers to obtain high ion fractions as the diameter of the cathode increases. This adds to the overall cost of the system and the cost of ownership. Further, using the DC power to the magnetron source to achieve plasma density means that the deposition rate and the ionization fraction are inextricably linked, where higher DC power gives a higher deposition rate and a higher ion fraction. A greater problem with the HCM than delivering the power to the cathode has been removing heat. The inventors of the HCM point out in their patent that the power required to operate the HCM increases as the cube of the diameter, while the cooling increases with the diameter squared. It would therefore be difficult to scale an HCM source to larger diameters while maintaining the same ion fractions as obtained in the smaller versions, due to the need to provide huge amounts of DC power and the difficulty in cooling the target sufficiently.

Accordingly, while the HCM has been useful in providing high energy plasma for iPVD systems, whether features of the HCM could be used to enhance the performance of an ICP source and, if so, how to combine the HCM and ICP features, have not been contemplated in the prior art.

SUMMARY OF THE INVENTION

An objective of the present invention is to increase the coupling of energy into a high-density inductively-coupled plasma in an iPVD apparatus of the type having an annular target. A further objective of the invention is to facilitate the use of ICP iPVD devices at lower operating pressures.

According to the present invention, principles of a Hollow Cathode Magnetron (HCM) are combined with principles of an iPVD source of the type having an annular target ICP with an RF energy source at its center. The combination is made by replacing the closed end of the HCM target with the RF ICP energy source from such an iPVD annular-target source. Optionally, a flat or conical ring-shaped annular-target magnetron-cathode may further be provided that surrounds the HCM, for example, around the open end of the HCM, that is, at the opposite end of the cylindrical HCM target from the RF energy source.

According to one of the illustrated embodiments of the present invention, a cathode of the HCM configuration is provided with the closed end removed so that the cathode includes a cylindrical target having two open ends. In one of the open ends of the cylindrical target, referred to herein for convenience as the RF source end, is placed an RF energy source. The RF energy source may be an ICP source that includes an external RF coil outside of the chamber that couples RF energy through a dielectric window that forms part of the chamber wall. A deposition shield may be located inside of the chamber to protect the window from deposition while permitting the coupling of RF energy from the coil, through the window and shield, and into the chamber.

In an alternative embodiment of the invention, an iPVD source may be constructed with two targets, a cylindrical target and a planar or frusto-conical annular target. The cylindrical target is arranged with a dielectric window at one end, protected by a baffle shield, through which is coupled RF energy from an antenna situated outside the vacuum chamber, and the planar or frusto-conical annular target at the other, facing the substrate and located coplanar with or below the open end of the cylindrical target. That is, the planar or frusto-conical annular target is located at the opposite end of the cylindrical target from the RF source. The two targets are electrically separate and powered independently, with each having its own separate magnetron magnet. Such an arrangement, though more complicated, can be used to improve film thickness uniformity or to increase film deposition rate, which is especially important for so-called "copper seed" deposition processes.

In another alternative embodiment, a cylindrical target may be provided with a small rim or flange at one or both ends. This conveniently adds to the rigidity of the cylindrical target and provides structural support for mounting. However, the plasma would normally not sputter such a flange region at the open end of the cylinder closest to the substrate, so deposits would typically build up on this area. To prevent such deposits from spalling off and contaminating the process chamber with particulates, the flange of the target should be textured or roughened.

The open end of the cylindrical target that is opposite the RF source, referred to herein for convenience as the processing end, faces the processing space within the vacuum chamber. Magnetron magnets behind the target support a sputtering plasma adjacent the inside surface of the cylindrical target and produce a magnetic cusp field that defines a magnetic mirror plane which separates the sputtering material source, which includes the cylindrical target and the RF energy source, from the processing space in which a semiconductor wafer is supported for iPVD processing. The magnetron magnets of the HCM also form a null region that extends from the mirror plane into the processing space and functions to facilitate extraction of ions from the plasma-source volume into the processing space.

The iPVD source of the present invention accomplishes the objectives of the invention with only a modest increase in initial cost and complexity over an ICP source or the HCM source alone. This increase in cost is more than offset by the savings in the cost of closed end HCM targets. In particular, if one takes into account the cost of targets for depositing materials such as Ta/TaN, the source of the present invention can cost less than a Ta/TaN source of the HCM design alone. In addition, a source according to the principles of the present invention is ideally suited to a deposition and etching process performed in the same chamber, because the invention provides comparable processing parameters for both deposition and etch processes.

Fabrication of a cylindrical cathode for the source of the present invention is much easier than fabricating a bucket type cathode typical of a current HCM source. Since the closed end of the bucket shaped HCM may be absent from the cathode of the present invention, less of the expensive target grade material is used in fabricating the target. Also, there is no need for a rotating magnetron behind the closed end of the target to sputter material from that portion of the target.

The deposition baffle shield, which may be used to cover the window with the source of the present invention, accumulates deposits but can be bead blasted to ensure good adhesion and minimize the flaking of particles. Further, the deposition baffle can be re-used many times, while the unused target material at the closed end of an HCM target can only be recycled, at best.

For a tantalum (Ta) or tantalum nitride (TaN) deposition process, a deposition baffle of molybdenum or another material that has similar coefficients of expansion to tantalum and has low electrical resistivity may be used. With a copper (Cu) and aluminum (Al) target, deposition baffles may be made of copper, aluminum or their alloys. RF from the ICP source more efficiently heats plasma than does DC only, as with an HCM alone, so the source of the present invention is easier to scale to larger diameters than the HCM source alone.

Adding RF through the end of the cylindrical portion of the HCM target is a more efficient way to heat the plasma, so less additional cooling of the target is required than would be required if one were attempting to achieve similar plasma densities using the DC source of the HCM alone. Further, deposition rate and ion fraction can be independently controlled with the present invention, where with the HCM both are controllable only by adjusting DC power to the cathode. Increasing RF power to increase ion fraction does not have to increase overall deposition rate with the present invention, and DC power need not be increased or sustained to increase ion fraction with the present invention, making it practical to switch between deposition and etch processes in the same chamber.

In an iPVD source having an annular target with an RF source at its center (for example, with the sources of U.S. Pat. Nos. 6,080,287 and 6,287,435), the DC power supply that powers the annular target does little to increase the power density of the high density plasma. If one uses the HCM in place of the annular target configuration, the DC power supplied to the cylindrical target can serve to increase the volume of high density low energy plasma within the source. This produces a higher ion fraction of metal coating material.

By so coupling the DC power of the magnetron cathode into the high density plasma, the high levels of DC power substantially contributes to the heating of the plasma and reduces the need for expensive high power RF supplies and matching networks. Increasing the plasma volume in this manner with the present invention over that achieved with the RF ICP plasma-source and annular target allows the same ionization fraction to be achieved at lower pressures, reducing the risk of gas phase nucleation and allowing for more relaxed tolerances on dark space components. Further, an anode ring can be used at the open end of the cylindrical cathode to reduce the likelihood that the target will arc to the deposition baffle. In addition, sputtered material that is not ionized will deposit on the opposite wall of the cylindrical cathode, from which it can be re-sputtered, increasing target utilization compared to other annular ICP iPVD sources.

The source of the present invention does introduce additional complexity beyond that of either of the HCM and ICP iPVD sources, considered alone. Taking into account the high cost of HCM targets, the cost of the targets, particularly of tantalum targets, are lower with the present invention. Because target costs are one of the largest contributors to the cost-of-ownership for ionized-PVD applications, target cost savings with the present invention are particularly significant. Little or no additional cost would be incurred by substituting the planar or frusto-conical annular target used in existing RF ICP sources with a cylindrical target HCM according to the present invention.

The sources of the present invention operates efficiently and effectively at pressures lower than those of the RF sources having only planar or frusto-conical annular targets. This would facilitate the performing of both deposition and etch processes in the same chamber, without requiring time-consuming pressure cycling, and would likely result in improved uniformity for the combined processes. The deposition and etching can be carried out at approximately 10 mTorr, or between approximately 1 and 40 mTorr.

These and other objectives and advantages of the present invention will be more readily apparent from the following detailed description.

DETAILED DESCRIPTION

Figure 1:
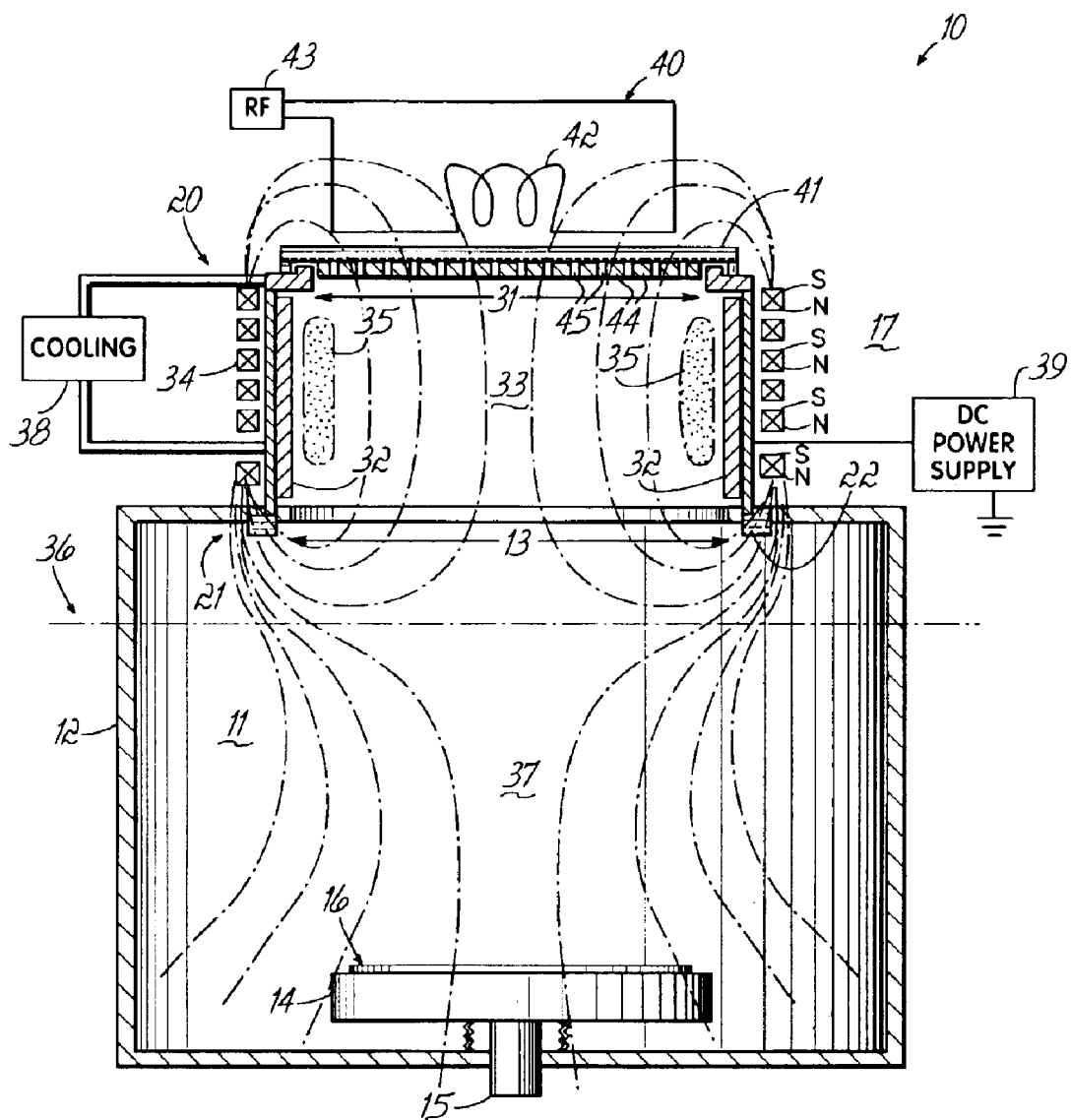
FIG. 1 is a diagrammatic cross-sectional view of a hybrid HCM-ICP source for an iPVD apparatus according to principles of the present invention.

FIG. 1 illustrates an ionized physical deposition apparatus 10 having a vacuum processing chamber 11 bounded by a chamber wall 12 that encloses a vacuum processing space within the chamber 11. A source 20 of ionized coating material, or iPVD source, is situated in an opening 13 in the top of the chamber wall 12 and forms a vacuum tight seal through an electrical insulator 22 around the lower edge 21 of the ionized material source 20 against the perimeter of the opening 13 in the chamber wall 12. A substrate support 14 is centered on an elevator 15 at the bottom of the chamber 11 for supporting a semiconductor wafer 16 thereon facing the ionized material source 20 across the processing space for processing. The chamber 11 is maintained at a vacuum by pumps (not shown), which may be conventional. The chamber wall 12 isolates the vacuum of the chamber 11 from an ambient clean-air atmosphere 17 outside of the chamber 11.

The ionized material source 20 includes a cylindrical coating material source or cylindrical target 32 that extends from the lower edge 21 of the ionized material source 20 to an inner circular opening 31 at its top. The ionized material source 20 also includes an RF energy source 40 mounted in the opening 31 of the coating target 32.

The cylindrical target 32 is of the hollow cathode magnetron or HCM type described in U.S. Pat. No. 5,482,611, but having two open ends at opposite ends of the cylindrical target 32. The cylindrical target 32 preferably forms a portion of the chamber wall 12 that separates the vacuum interior of the chamber 11 from the external ambient atmosphere 17. The cylindrical target 32 surrounds a cylindrical plasma-source volume 33 inside of the chamber 11 and has an inner cylindrical sputtering surface that faces the plasma-source volume 33. The plasma-source volume 33 communicates with a processing space within the chamber 11.

The cylindrical target 32 is part of a sputtering cathode that has a magnetron magnet or magnet array 34 located behind the target 32 that is configured to produce a stationary magnetic field that forms a closed circumferential magnetic tunnel 35 around the inside of the plasma-source volume 33 adjacent the inner sputtering surface of the cylindrical target 32. The magnet array 34 is also configured to produce a cusp field that defines a magnetic mirror plane 36 inside of the chamber 11 below and parallel to the opening 13. The magnetic field produced by the magnet array 34 also defines a loss-cone 37 extending from the magnetic mirror plane 36 through the center of the processing space within the chamber 11. A DC source 39 is electrically connected to the cylindrical target 32 to apply a potential to the cylindrical target 32 that is negative with respect to the chamber wall. This potential facilitates the generation of electrons and the attraction toward the sputtering surface of the target of gas ions that are produced from gas atoms that collide with electrons in the magnetic tunnel. Cooling liquid is circulated behind the target 32 by a cooling system 38, which removes heat produced during the sputtering of the cylindrical target 32.

The ionized material source 20, as described, is similar to that more fully discussed in U.S. Pat. No. 5,482,611, which has been incorporated by reference above, and referred to herein as the HCM source. The ionized material source 20 differs from the HCM source of that patent in that, rather than the cylindrical target 32 forming a cavity of the sputtering material having only one open end, the cylindrical target 32, according to the invention, is in the shape of a cylinder that is open at both ends, with one end occupied by the RF source 40.

Figure 2:
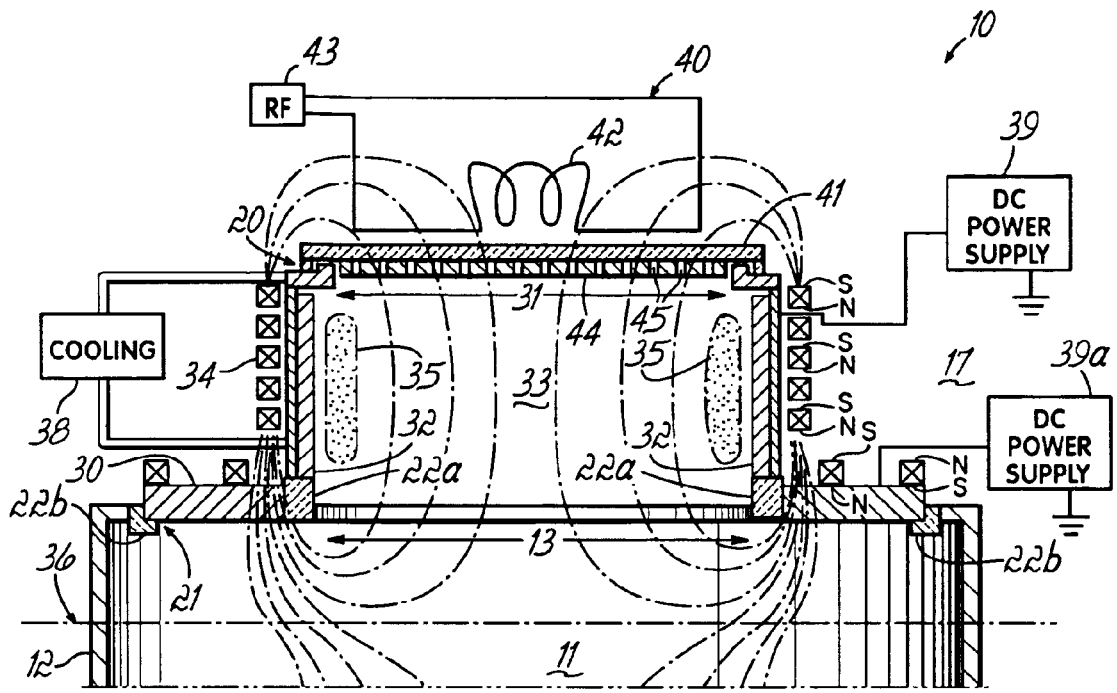
FIG. 2 is a diagrammatic cross-sectional view, similar to FIG. 1, of another embodiment of a hybrid HCM-ICP source according to principles of the present invention.
Figure 3:
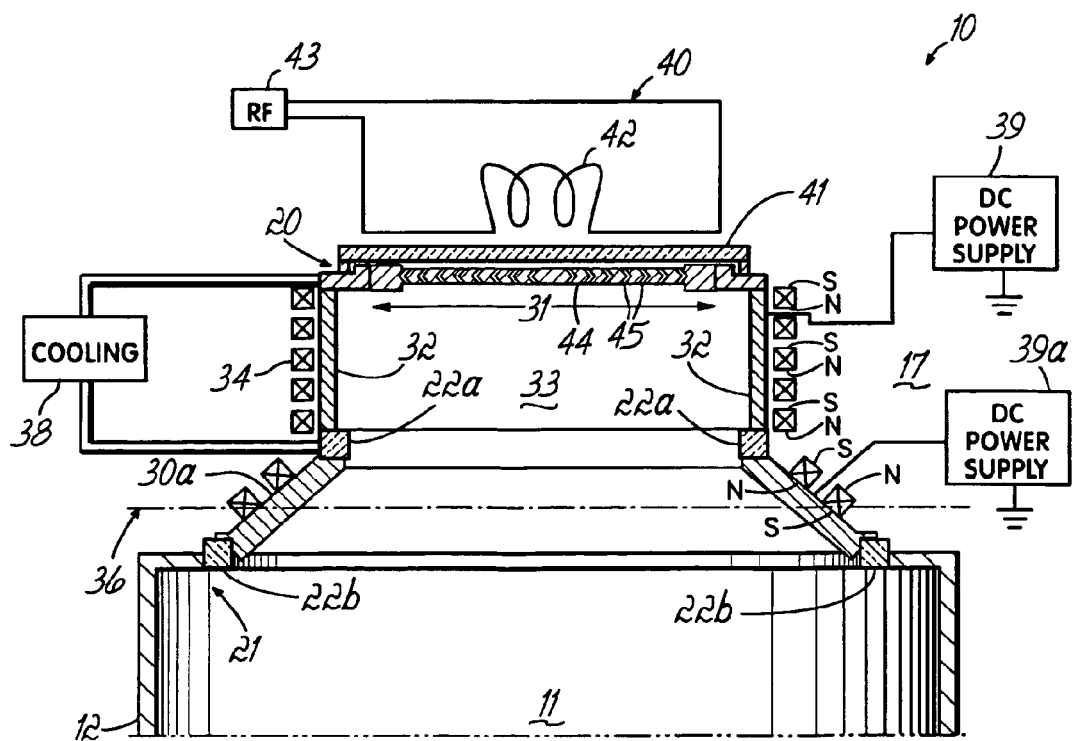
FIG. 3 is a diagrammatic cross-sectional view, similar to FIGS. 1 and 2, of still another embodiment of a hybrid HCM-ICP source according to principles of the present invention.

The ionized material source 20, in addition to the cylindrical coating material source or cylindrical target 32, may optionally include a further annular target 30 surrounding the target 32, as illustrated in FIG. 2. The target 30 may be of the types described in U.S. Pat. Nos. 6,080,287 and 6,287,435, which have been incorporated by reference above. The targets 32 and 30 are insulated from each other by the insulator 22a and from the grounded chamber wall 12 by insulator 22b. An anode ring (not shown) could also be placed between the targets 30 and 32, insulated from both targets 30 and 32 and the grounded chamber wall 12. Both targets 32 and 30 are separately energized with negative DC potential from two separate DC power sources 39 and 39a, respectively. The targets 30 and 32 are insulated from each other so that they can be separately controlled from separate outputs of the DC power sources 39 and 39a. The target 30 is illustrated as a flat ring-shaped annular target in FIG. 2. Alternatively, the annular target may be frusto-conical, and configured as target 30a as illustrated in FIG. 3. Such additional targets 30, 30a may be desired in some configurations to improve coating material uniformity on the substrate or to increase deposition rate.

Referring to FIGS. 1, 2 and 3, the RF source 40 includes a dielectric window 41, illustrated as circular and planar, that is sealed around its circular rim to the periphery of the opening 31 in the top of the cylindrical target 32. The RF source 40 also includes an RF coil or antenna 42 situated outside of the chamber 11 close to the window 41 so as to couple RF energy through the window 41 and into the volume 33 within the chamber 11. The coil 42 is connected through a matching network (not shown) to an RF generator 43. On the inside of the window 41, close thereto, is a deposition baffle or shield 44 that protects the window 41 from deposits of coating material. The shield 44 has slots 45 therein that are configured and oriented relative to the coil 42 to prevent the induction of currents in the shield or in coatings that may form on the shield that would attenuate magnetic energy from being coupled from the coil 42 into the volume 33. The details and operation of the RF energy source 40 are more fully described in U.S. Pat. Nos. 6,080,287 and 6,287,435, which have been incorporated by reference above. With the iPVD applications for the present invention, the deposition shield may be advantageously manufactured from, or coated with, copper, molybdenum or aluminum.

The RF energy coupled by the coil 42 from the RF power generator 43 combines with energy from the DC power supply 39 to produce a high density plasma within the volume 33. Both of the power sources 43 and 39 have the capability of contributing substantially to the total energy coupled to the plasma, each typically expected to contribute at least twenty percent of the total energy of the high density plasma, where desirable for the process. The combination of the RF source 40 with the hollow cathode magnetron with a cylindrical target 32 produces greater plasma density than the sources of any of the patents identified above would produce alone. It further uses targets that are substantially less expensive than those required for the hollow cathode magnetron described in U.S. Pat. No. 5,482,611.

While the above description and accompanying drawings set forth various embodiments of the invention, it will be apparent to those skilled in the art that additions and modifications may be made without departing from the principles of the invention.

What is claimed is:

1. An ionized physical vapor deposition apparatus for processing semiconductor substrates comprising:

a vacuum chamber bounded by a chamber wall, the chamber having therein a plasma processing space and a substrate support configured to support a semiconductor substrate facing the processing space for processing;

a magnetron sputtering cathode including a hollow cylindrical sputtering target having a sputtering surface in communication with the inside of the chamber, a DC power source outside of the chamber electrically connected to the target, and a magnet assembly behind the target;

the sputtering target surrounding a cylindrical plasma-source volume within the chamber and adjacent the processing space, the target having two open ends at opposite ends of the cylindrical volume;

the magnet assembly being outside of the plasma-source volume and configured to generate a magnetic field inside of the chamber, the field including a closed magnetic tunnel adjacent the sputtering surface of the target to confine electrons near the sputtering surface of the target, a cusp field that defines a magnetic-mirror plane between the plasma-source volume and the processing space and a null magnetic field extending from the cusp plane into the processing space;

a dielectric window at the open end of the target that is opposite from the processing space, the window forming part of the chamber wall;

an RF power source outside of the chamber;

an RF coil outside of the chamber behind the window and electrically coupled to the RF power source, the RF coil being configured to couple RF energy from the RF power source through the window and into the plasma-source volume; and the target, the magnetron magnet and the RF coil being configured to cooperate to form a high density plasma within the volume that includes ions of material sputtered from the target and that is energized substantially by each of the DC power source and the RF power source.

2. The apparatus of claim 1 further comprising:

an annular sputtering target surrounding the open end of the cylindrical sputtering target at the processing end thereof, the annular sputtering target having a ring shaped sputtering surface facing a processing space having a substrate support therein.

3. The apparatus of claim 1 further comprising:

a deposition shield closely spaced from and parallel to the window and inside of the chamber on the RF source end of the cylindrical sputtering target on the opposite side of the window from the antenna, the shield being configured to protect the window from deposits of sputtered material and to permit the inductive coupling of RF energy from the antenna into the plasma-source volume.

4. An iPVD source of ionized sputtered material comprising:

a magnetron sputtering cathode including a hollow cylindrical sputtering target, a first DC power source outside of the chamber electrically connected to the cylindrical sputtering target, and a magnet assembly behind the target;

the cylindrical sputtering target surrounding a cylindrical plasma-source volume within the chamber, the cylindrical sputtering target having a cylindrical sputtering surface in communication with the plasma-source volume and having two open ends at opposite ends of the volume, including an RF source end and a processing end;

the magnet assembly being outside of the plasma-source volume and configured to generate a magnetic field inside of the plasma-source volume, the field including a closed magnetic tunnel adjacent the sputtering surface of the target to confine electrons near the surface of the target, a cusp field that defines a magnetic mirror plane parallel to the processing end of the cylindrical sputtering target and a null magnetic field extending beyond the magnetic mirror plane;

a dielectric window at the RF source end of the cylindrical sputtering target;

an RF power source including an RF antenna on the opposite side of the window from the plasma-source volume and electrically coupled to the RF power source, the RF antenna being configured to couple RF energy from the RF power source through the window and into the plasma-source volume; and the target, the magnetron magnet and the RF antenna being configured to cooperate to form a high density plasma within the plasma-source volume that includes ions of material sputtered from the target and that is energized substantially by each of the DC power source and the RF power source.

5. The iPVD source of claim 4 further comprising:
an annular sputtering target adjacent and surrounding the open processing end of the cylindrical sputtering target facing a processing space.

6. The source of claim 5 wherein the annular sputtering target is a planar ring-shaped annular sputtering target.

7. The source of claim 5 wherein the annular sputtering target is a frusto-conical sputtering target.

8. The source of claim 5 further comprising:
an annular permanent magnet positioned behind the annular sputtering target.

9. The source of claim 5 further comprising:
a second DC power supply connected to the annular sputtering target; and
the annular sputtering target being electrically insulated from the cylindrical sputtering target.

10. The source of claim 9 further comprising:
the first and second DC power supplies are separately controllable to adjust the relative sputtering from the cylindrical and the annular sputtering targets.

11. The iPVD source of claim 4 further comprising:
a deposition shield closely spaced from and parallel to the window on the opposite side thereof from the antenna, the shield being configured to protect the window from deposits of sputtered material and to permit the inductive coupling of RF energy from the antenna into the plasma-source volume.

12. The iPVD source of claim 11 wherein:
the deposition shield is selected from the group consisting essentially of the metals copper, molybdenum and aluminum and their alloys.

13. The iPVD source of claim 11 wherein:
the deposition shield is coated with a metal selected from the group consisting essentially of copper, molybdenum and aluminum and their alloys.

14. The iPVD source of claim 4 wherein:
the cylindrical sputtering target has an annular flange formed integrally thereof on at least one of its open ends.

15. The iPVD source of claim 4 wherein:
the cylindrical sputtering target has an annular flange formed integrally thereof on at least one of its open ends that is textured to increase adhesion of deposited material thereon.

16. An iPVD method comprising:
providing a vacuum processing apparatus having a vacuum chamber, a coating material source at one end of the vacuum chamber and a substrate support within the vacuum chamber facing the coating material source;
providing the coating material source with a hollow cylindrical magnetron sputtering target having an open processing end facing the processing chamber and an open RF source end covered by a dielectric window having a RF antenna on the outside thereof for coupling RF energy through the window and into a plasma-source volume surrounded by the cylindrical magnetron sputtering target;
applying a DC potential to the sputtering target and sputtering material therefrom into the volume;
ionizing the material in the volume sputtered from the sputtering target with energy from the RF antenna and energy from the DC potential to produce a high density plasma within the plasma-source volume that includes ions of material sputtered from the target energized substantially by each of the DC potential and the RF power; and
processing a substrate in the vacuum chamber by depositing thereon the ionized sputtered material from the plasma-source volume.

17. The iPVD method of claim 16 further comprising:
alternately depositing the ionized material onto the substrate and etching the substrate within the vacuum chamber.

18. The iPVD method of claim 17 further comprising:
so processing the substrate through a plurality of deposition and etch cycles.

19. The iPVD method of claim 17 wherein the depositing and etching occur
at approximately between 1 mTorr and 40 mTorr.

20. The iPVD method of claim 16 further comprising:
cycling DC potential to the cylindrical sputtering target alternately on and off to respectively deposit material onto and etch the substrate.

* * * * *